(12) United States Patent
Luckett et al.

(10) Patent No.: US 10,270,444 B1
(45) Date of Patent: Apr. 23, 2019

(54) DELAYED BOOST OF DRIVER OUTPUT SIGNALS

(71) Applicant: HEWLETT PACKARD ENTERPRISE DEVELOPMENT LP, Houston, TX (US)

(72) Inventors: Edward James Luckett, Fort Collins, CO (US); Christopher Allan Poirier, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/945,471

(22) Filed: Apr. 4, 2018

(51) Int. Cl.
*H03K 19/003* (2006.01)

(52) U.S. Cl.
CPC .................. *H03K 19/00323* (2013.01)

(58) Field of Classification Search
CPC ............ H03K 19/00323; H03K 19/01; H03K 19/017; H03K 19/20; H03K 17/042; H03K 17/04206; H03K 17/04; H03K 5/12; H03K 5/01
USPC .............. 327/108–112, 170, 427, 434, 437; 326/82, 83, 87
See application file for complete search history.

(56) References Cited

U.S. PATENT DOCUMENTS

| | | |
|---|---|---|
| 5,726,596 A | 3/1998 | Perez |
| 5,760,610 A | 6/1998 | Naffziger |
| 6,459,307 B2 | 10/2002 | Kim |
| 6,909,308 B2 * | 6/2005 | Hunt ................ H03K 19/01721 326/31 |
| 6,937,066 B2 | 8/2005 | Porter et al. |
| 7,863,933 B2 | 1/2011 | Chuang |
| 2001/0017554 A1 * | 8/2001 | Tsuji ................ H03K 17/164 327/112 |
| 2001/0026178 A1 * | 10/2001 | Itoh ................ H03K 17/167 327/112 |

OTHER PUBLICATIONS

Dave, et al., "A Process Variation Tolerant, High-speed and Low-power Current Mode Signaling Scheme for On-chip Interconnects", May 10-12, 2009, Boston, MA, USA, pp. 389-392. https://dl.acm.org/citation.cfm?id=1531630.

Mahyuddin, "A Novel Low-swing Voltage Driver Design and the Analysis of Its Robustness to the Effects of Process Variation and External Disturbances", Dec. 5, 2014, 217 pages, https://pdfs.semanticscholar.org/d6e6/2d67935c62f72f7a3ee02d70d1815c62f748.pdf.

* cited by examiner

*Primary Examiner* — Thomas Skibinski
(74) *Attorney, Agent, or Firm* — Manneva & Kang, P.C.

(57) ABSTRACT

According to examples, an apparatus may include a field effect transistor (FET), a driver to receive an input signal and to output a driver output signal, and a gate to receive the input signal. The apparatus may also include a delay element to receive the driver output signal and to output a delayed signal to the gate after a delay from receipt of the driver output signal, in which the gate is to output a gate output signal to the FET in response to receipt of the input signal and the delayed signal, and in which receipt of the gate output signal by the FET drives the FET to provide a boost to the driver output signal.

17 Claims, 4 Drawing Sheets

US 10,270,444 B1

DELAYED BOOST OF DRIVER OUTPUT SIGNALS

STATEMENT OF GOVERNMENT INTEREST

This invention was made with Government support under Prime Contract No. DE-AC52-07NA27344 awarded by DOE. The Government has certain rights in this invention.

BACKGROUND

Advancements in semiconductor manufacturing technologies have enabled integrated circuits to be designed and fabricated to have ever increasingly smaller sizes. This has also led to increasing numbers of integrated circuits being packaged onto substrates having increasingly smaller sizes. The integrated circuits often include transmitters and receivers through which the integrated circuits may communicate signals with each other in performing various processing functions. Due to parasitic resistance or parasitic capacitance in the connections between the transmitters and receivers, there may be a delay and a reduction in edge rate performance in the signals communicated between the integrated circuits.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
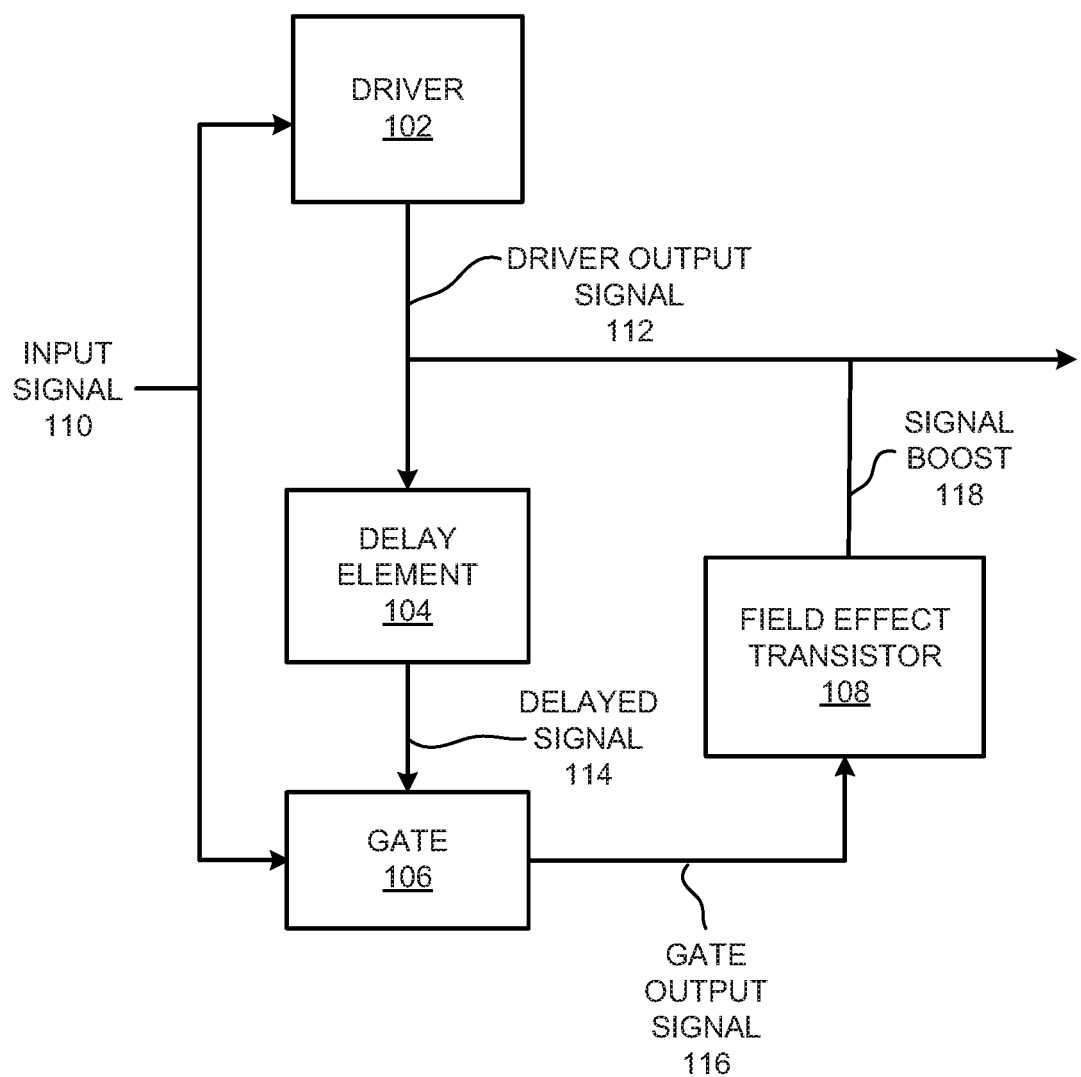
FIG. 1 shows a block diagram of an example apparatus that may apply a delayed boost to a driver output signal.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Current transmitter topologies typically use complementary metal-oxide-semiconductors (CMOS) drivers that do not have sufficient drive strength to provide suitable edge rates, delay, and power consumption. Insufficient drive strength may result in poorer edge rates and delay at receivers, which may lead to higher variation in overall transmission and receiving performance. For instance, due to parasitic capacitance present in a routing between a transmitter and a receiver, the equivalent input capacitance seen at the transmitter may be greater than a standard CMOS buffer may adequately drive. In addition, the field effect transistors (FETs) may lose drive strength due to operating in the linear region as the edge starts approaching the final state of 0 V or SUPPLY. At the receiver side, due to process variation at the receiver side FETs, the poor edge rates may exacerbate skew between the transmitted data bits. In addition, because of the issue with edge rates, both PMOS and NMOS FETs may spend more time turned on simultaneously, leading to increased current consumption.

Disclosed herein are apparatuses for providing delayed boosts to driver output signals to improve edge rates and may thus obviate many of the issues discussed above. The apparatuses disclosed herein may include a FET, a driver to receive an input signal and to output a driver output signal, and a gate to receive the input signal. The apparatuses may also include a delay element to receive the driver output signal and to output a delayed signal to the gate after a delay from receipt of the driver output signal. Responsive to receipt of the delayed signal, the gate may output a gate output signal to the FET and the FET, in response to receipt of the gate output signal, may be driven to provide a boost (or additional signal strength) at a tail end of the driver output signal. According to examples, the FET may be a positive channel FET (PFET) and the gate may include a NAND gate. In this regard, the PFET may apply the additional signal strength in instances in which the driver output signal is going high.

The apparatuses disclosed herein may also include a negative channel FET (NFET), a second delay element, and a second gate (e.g., a NOR gate) to activate the NFET. The second gate may receive the input signal and a second delayed signal from the second delay element. In response to receipt of the input signal and the second delay signal, the second gate may output of a second gate output signal to the NFET. The NFET, in response to receipt of the second gate output signal may be driven to apply a boost (or additional signal strength) at a tail end of the driver output signal, in which the driver output signal is going low.

Through implementation of the apparatuses disclosed herein, edge rates of driver output signals may be improved as the driver output signals are ramped up or ramped down. As a result, a receiver of the driver output signals may experience less skew and delay variation between transmitted bits, which may result in reduced current consumption compared with current transmitter topologies.

Figure 2:
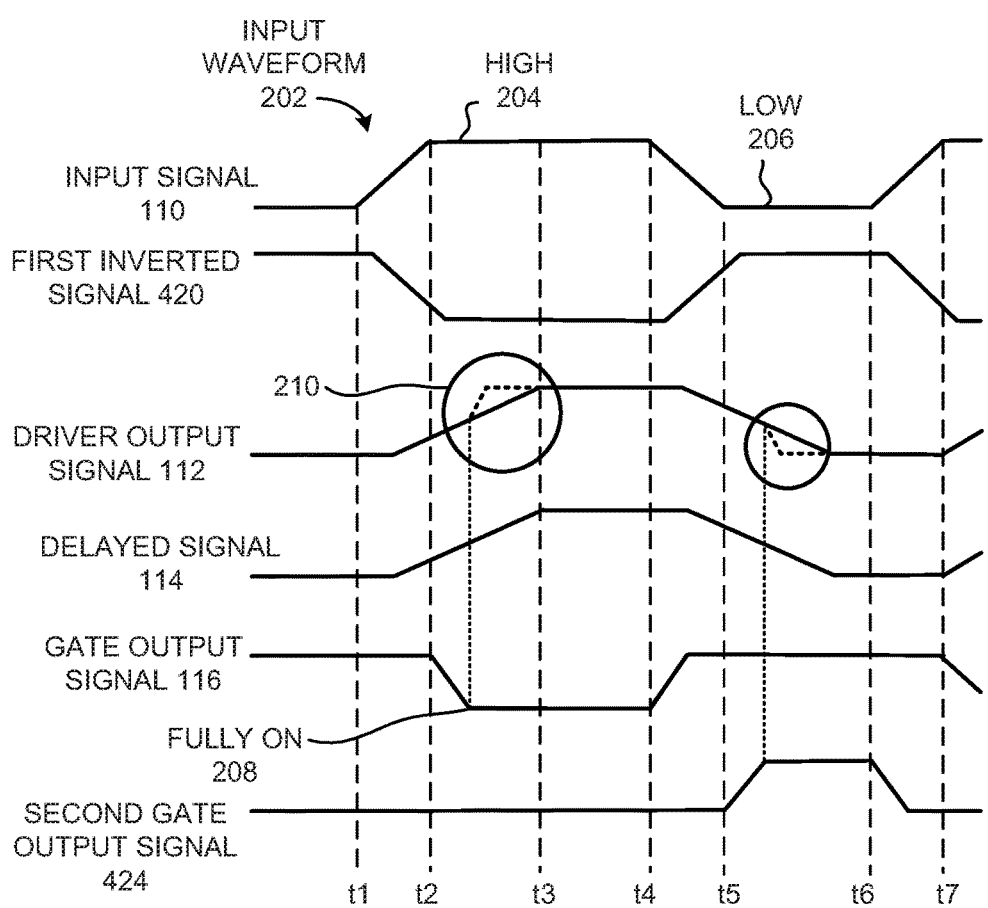
FIG. 2 shows an example timing diagram that shows the signal output levels of various components in the apparatus depicted in FIG. 1 over a time period.

Reference is first made to FIGS. 1 and 2. FIG. 1 shows a block diagram of an example apparatus 100 that may apply a delayed boost to a driver output signal. FIG. 2 shows an example timing diagram 200 that shows the signal output levels of various components in the apparatus 100 over a time period. It should be understood that the example apparatus 100 depicted in FIG. 1 and the timing diagram 200 depicted in FIG. 2 may include additional features and that some of the features described herein may be removed and/or modified without departing from the scopes of the apparatus 100 or the timing diagram 200.

The apparatus 100 may be a circuit or may form part of a circuit in a signal transmitter or a signal transmitter/receiver. For instance, the apparatus 100 may be an integrated circuit, such as a die, that is to drive the output of a signal to another integrated circuit via a connection. By way of example, the apparatus 100 may be part of a die on an interposer of a network switch. In other examples, the apparatus 100 may be part of a die in a computing device, a server computer, or the like. In any regard, the apparatus 100 may provide a performance boost to output signals by, for instance, providing pulses of drive strength during output of the output signals. Particularly, the apparatus 100 may provide a performance boost to improve edge rates as the output signals are ramped up or ramped down, which may enable a receiver of the output signals to experience less skew and delay variation between transmitted bits.

As shown in FIG. 1, the apparatus 100 may include a driver 102, a delay element 104, a gate 106, and a field effect transistor (FET) 108. The driver 102 and the gate 106 may both receive an input signal 110. The input signal 110 may include an input waveform 202 (as shown in FIG. 2) that may represent bits of data that are to be transmitted from the apparatus 100. The input waveform 202 may include high signal 204 portions and low signal 206 portions. As discussed in greater detail herein, the driver 102 may include a first inverter and a second inverter and the second inverter may output a driver output signal 112 that may be transmitted out of the apparatus 100.

The driver 102 may be connected to the delay element 104 such that the delay element 104 may receive the driver output signal 112. The delay element 104 may delay the output of a delayed signal 114 with respect to when the delay element 104 received the driver output signal 112. In this regard, the gate 106 may receive the input signal 110 prior to receiving the delayed signal 114. Responsive to receiving both the input signal 110 and the delayed signal 114, the gate 106 may output a gate output signal 116. That is, and as shown in FIG. 2, the input waveform 202 may begin to be driven high at time t1 and may be ramped up to the high level 204 at time t2. However, the gate output signal 116 may begin to be driven low at time t2, for instance, through operation of the delay element 104 and the gate 106. As the gate output signal 116 is ramped down, the FET 108 may begin to be turned on, e.g., at t2, until the FET 108 is fully on 208. When the FET 108 is fully on 208, the FET 108 may output a signal boost 118 into the driver output signal 112. In addition, application of the signal boost 118 may bring the driver output signal 112 closer to a power supply rail at a faster rate as denoted by the dotted line in the circle 210.

Figure 3:
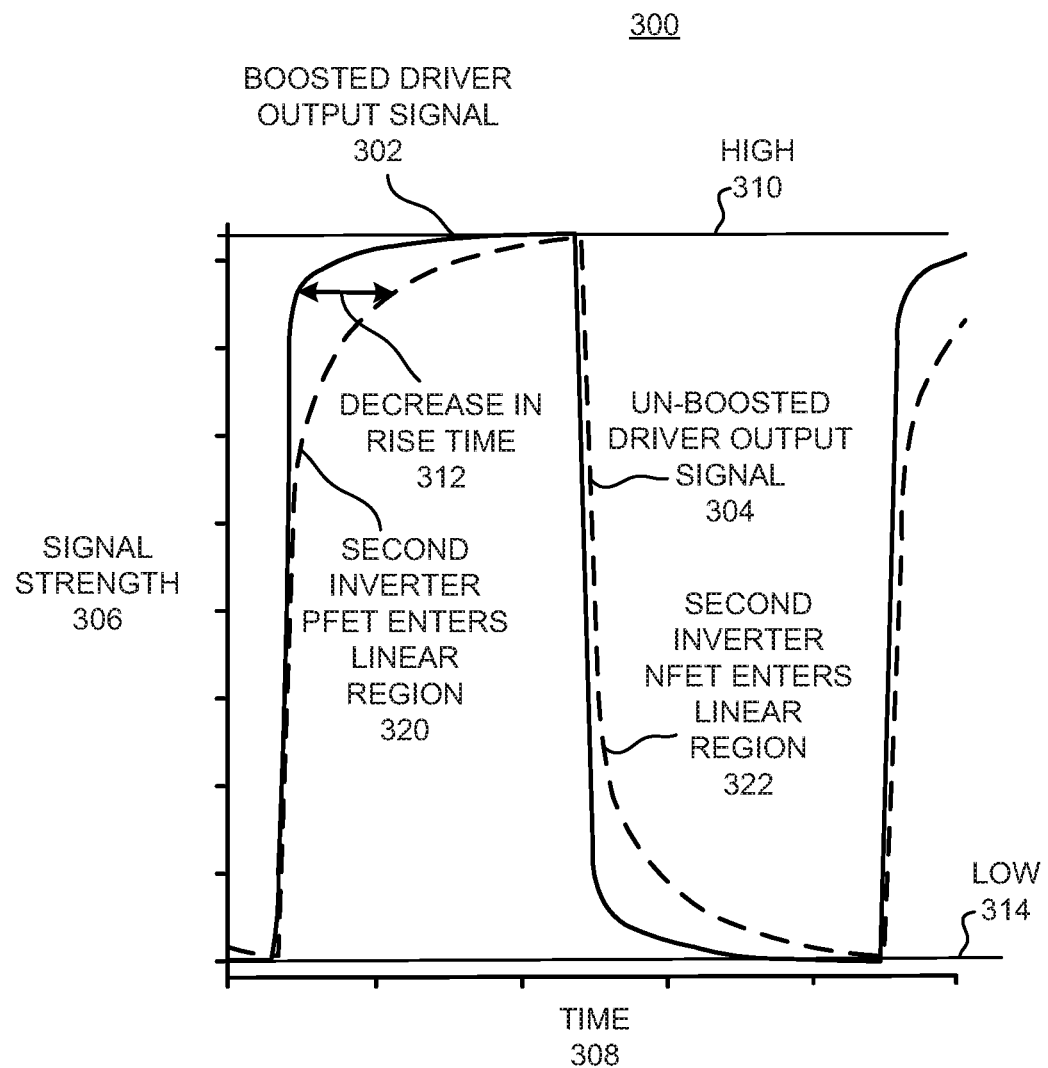
FIG. 3 shows a diagram of an example boosted driver output signal compared with an un-boosted driver output signal.

Reference is now made to FIG. 3, which shows a diagram 300 of an example boosted driver output signal 302 compared with an un-boosted driver output signal 304. As shown, the boosted driver output signal 302 is depicted as a solid line and the un-boosted driver output signal 304 is depicted as a dashed line. In the diagram 300, a first axis represents signal strength 306 and a second axis represents time 308. In this regard, the diagram 300 shows signal strength 306 as a function of time 308.

As shown, the un-boosted driver output signal 304 may be driven high 310 at a relatively slower rate as compared with the boosted driver output signal 302. The decrease in the time required for the boosted driver output signal 302 to be driven high 310 is denoted by the arrow 312. In one regard, by increasing the rate at which the driver output signal 112, 302 is driven high to 310, the edge rate and delay performance of the apparatus 100 may be improved. In addition, a receiver circuitry that receives the boosted driver output signal 302 may experience a decrease in current due to the decreased edge rate, which may lower a crowbar current at the input of the receiver circuitry. In addition to the reduction in the crowbar current, the improved edge rates may cause the receiver circuitry to be less susceptible to process variation, which may result in less skew and delay variation between transmitted bits.

Figure 4:
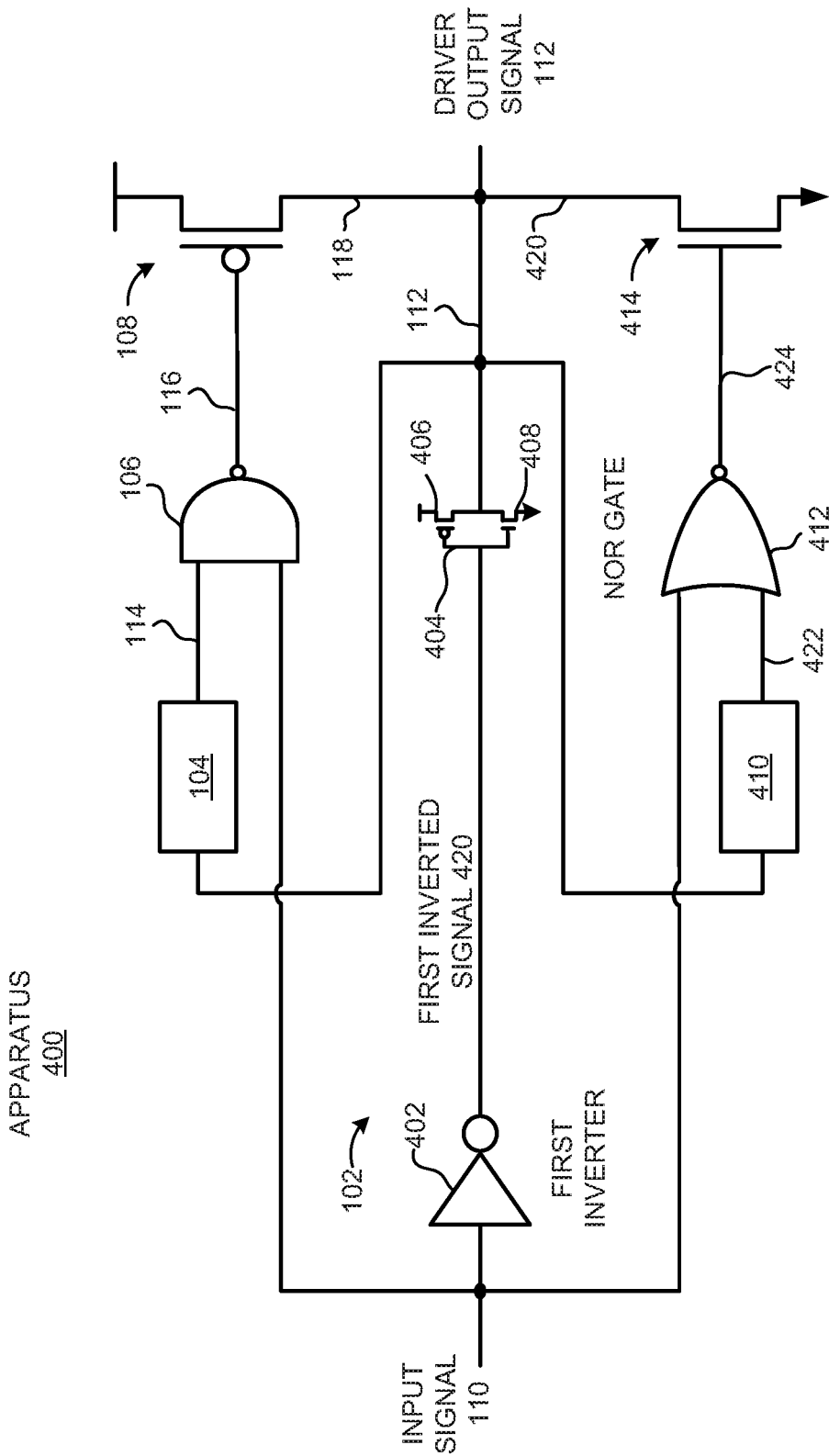
FIG. 4 show an example apparatus that may apply a delayed boost to a driver output signal.

Turning now to FIG. 4, there is shown a block diagram of an example apparatus 400 that may apply a delayed boost to a driver output signal. It should be understood that the example apparatus 400 depicted in FIG. 4 may include additional features and that some of the features described herein may be removed and/or modified without departing from the scope of the apparatus 400.

The apparatus 400 may be a circuit or may form part of a circuit in a signal transmitter or a signal transmitter/receiver. The apparatus 400 may include the same or similar features as the apparatus 100 depicted in FIG. 1, but may depict additional features with respect to the features in the apparatus 100. As shown, the apparatus 400 may include the driver 102, the delay element 104, the gate 106, and the FET 108. The driver 102 may include a first inverter 402 and a second inverter 404, and may function as a buffer. The second inverter 404 may include a second inverter positive channel FET (PFET) 406 and a second inverter negative channel FET (NFET) 408. The gate 106 may be a NAND gate. In addition, the FET 108 may be a PFET. The apparatus 400 may also include a second delay element 410, a second gate 412, and an NFET 414. The second gate 412 may a NOR gate.

In operation, an input signal 110 may be supplied into the apparatus 400. The input signal 110 may be split and directed to the first inverter 402, the NAND gate 106, and the NOR gate 412. The first inverter 402 may invert the input signal 110 and may output a first inverted signal 420 (as shown in FIG. 2), which may be inputted into the second inverter 404. The second inverter 404 may invert the first inverted signal 420 and may output a driver output signal 112. The driver output signal 112 may be split and directed to the first delay element 104 and the second delay element 410. The first delay element 104 may output a first delayed signal 114 following a delay with respect to the input signal 110 being supplied into the NAND gate 106. Similarly, the second delay element 410 may output a second delayed signal 422 following a delay with respect to the input signal 110 being supplied into the NOR gate 412. The first delay element 104 and the second delay element 410 may include any suitable components, e.g., resistors, inverters, buffers, or the like, to delay the propagation of the driver output signals 112 through the first delay element 104 and the second delay element 410.

In instances in which the input signal 110 is high, the second inverter PFET 406 may drive the driver output signal 112 high. Particularly, the second inverter PFET 406 may be saturated when the output of the driver output signal 112 is started, but may begin to go into the linear region at some point during output of the driver output signal 112. This may graphically be represented in FIG. 3 as a time at which the second inverter PFET 406 enters the linear region 320. As shown in FIG. 3, when the second inverter PFET 406 enters the linear region 320, the signal strength of the driver output signal 112 may begin to decrease at a first rate over time. The rate at which the signal strength of the driver output signal 112 may decrease may be mitigated through operation of the first delay element 104, the NAND gate 106, and the PFET 108 as discussed herein.

In response to the NAND gate 106 receiving both the input signal 110 and the delayed signal 114, and both of the input signal 110 and the delayed signal 114 being high, the NAND gate 106 may output a low signal to the PFET 108. Output of the low signal to the PFET 108 may drive the PFET 108 to provide additional drive strength to pull the driver output signal 112 closer to the power supply rail. As shown in FIG. 3, the additional drive strength may cause the rate at which the signal strength of the driver output signal 112 increases to be maintained for a longer period of time, e.g., may bring the driver output signal 112 to the power supply rail faster. As a result, the edge rate and delay performance of the apparatus 400 may be improved when being driven high.

In instances in which the input signal 110 is low, the second inverter NFET 408 may drive the driver output signal 112 low. Particularly, the second inverter NFET 408 may be saturated when the output of the driver output signal 112 is started, but may begin to go into the linear region at some point during output of the driver output signal 112. This may graphically be represented in FIG. 3 as a time at which the second inverter NFET 408 enters the linear region 322. As shown in FIG. 3, when the second inverter NFET 408 enters the linear region 322, the signal strength 306 of the driver output signal 112 may begin to decrease at a first rate over time. The rate at which the signal strength of driver output signal 112 may decrease may be mitigated through operation of the second delay element 410, the NOR gate 412, and the NFET 414 as discussed herein.

In response to the NOR gate 412 receiving both the input signal 110 and the second delayed signal 422, the NOR gate 412 may output a second gate output signal 424 to the NFET 414. In addition, in response to both of the input signal 110 and the second delayed signal 422 being low, the NOR gate 412 may output a high signal to the NFET 414. Output of the high signal to the NFET 414 may drive the NFET 414 to output a signal boost 420 to provide additional drive strength to pull the driver output signal 112 closer to ground. As shown in FIG. 3, the additional drive strength may cause the rate at which the signal strength of the driver output signal 112 decreases to be maintained for a longer period of time. As a result, the edge rate and delay performance of the apparatus 400 may be improved when being driven low, e.g., may bring the driver output signal 112 to ground faster.

According to examples, the first delay element 104 may be fabricated to delay output of the first gate output signal 116 a predetermined length of time to supplement the driver output signal 112 from the second inverter PFET 406. Likewise, the second delay element 410 may delay output of the second gate output signal 424 a second predetermined length of time to supplement the driver output signal 112 from the second inverter NFET 408. The second predetermined length of time may be the same as or may differ from the predetermined length of time. In any regard, the first delay element 104 and the second delay element 410 may be constructed such that respective gate output signals 116, 424 may be outputted near tail ends of the second inverter PFET 406 or the second inverter NFET 408 outputs. As such, the PFET 108 or the NFET 414 may supply additional signal strength near the tail ends of the second inverter PFET 406 or the second inverter NFET 408 outputs.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus comprising:
a first field effect transistor (FET);
a second FET;
a driver to receive an input signal and to output a driver output signal;
a first gate to receive the input signal;
a second gate to receive the input signal;
a first delay element to receive the driver output signal and to output a first delayed signal to the first gate after a first delay from receipt of the driver output signal, wherein the first gate is to output a first gate output signal to the first FET in response to receipt of the input signal and the first delayed signal, and wherein receipt of the first gate output signal by the first FET drives the first FET to provide a boost to the driver output signal; and
a second delay element to receive the driver output signal and to output a second delayed signal to the second gate after a second delay from receipt of the driver output signal, wherein the second gate is to output a second gate output signal to the second FET in response to receipt of the input signal and the second delayed signal, wherein receipt of the second output signal by the second FET drives the second FET to provide a boost to the driver output signal.

2. The apparatus of claim 1, wherein the gate is to output the gate output signal in response to the input signal being high and the driver output signal being high.

3. The apparatus of claim 1, wherein the second gate is to output the second gate output signal in response to the input signal being low and the driver output signal being low.

4. The apparatus of claim 1, wherein the first gate is a NAND gate, the first FET is a positive channel FET (PFET), the second gate is a NOR gate, and the second FET is a negative channel FET (NFET).

5. The apparatus of claim 1, wherein the driver comprises a first inverter and a second inverter, the second inverter having a second inverter PFET and a second inverter NFET.

6. The apparatus of claim 5, wherein the first delay element is to delay the output of the first delayed signal a predetermined length of time to supplement the driver output signal from the second inverter PFET and the second delay element is to delay the output of the second delayed signal a predetermined length of time to supplement the driver output signal from the second inverter NFET.

7. An apparatus comprising:
a driver to receive an input signal and to output a driver output signal;
a first delay element to receive the driver output signal and to output a first delayed output signal;
a first gate to receive the input signal and the first delayed output signal, wherein the first delay element causes the first gate to receive the input signal prior to receiving the first delayed output signal, the first gate to output a first output signal in response to receipt of the first delayed output signal and the input signal;
a first field effect transistor (FET) to be driven to provide additional drive strength to the driver output signal responsive to receipt of the first output signal;
a second delay element to receive the driver output signal and to output a second delayed output signal;
a second gate to receive the input signal and the second delayed output signal, wherein the second delay element causes the second gate to receive the input signal prior to receiving the second delayed output signal, the second gate to output a second output signal in response to receipt of the second delayed output signal and the input signal; and a second field effect transistor (FET) to be driven to provide additional drive strength to the driver output signal responsive to receipt of the second output signal.

8. The apparatus of claim 7, wherein the first gate is to output the first output signal in response to the input signal and the first delayed output signal being high.

9. The apparatus of claim 7, wherein the first gate is a NAND gate and the first FET is a positive channel field effect transistor.

10. The apparatus of claim 7, wherein the second gate is to output the second output signal in response to the input signal and the second delayed output signal being low.

11. The apparatus of claim 7, wherein the second gate is a NOR gate and the second FET is a negative channel field effect transistor (NFET).

12. The apparatus of claim 7, wherein the driver comprises a first inverter and a second inverter, the second inverter having a second inverter PFET and a second inverter NFET.

13. The apparatus of claim 12, wherein the first delay element is to delay the output of the first delayed output signal a predetermined length of time to supplement the driver output signal from the second inverter PFET and the second delay element is to delay the output of the second delayed output signal a predetermined length of time to supplement the driver output signal from the second inverter NFET.

14. A circuit comprising:
a first inverter to receive an input signal and to output a first inverted signal;
a second inverter to receive the first inverted signal and to output a driver output signal;
a first delay element to receive the driver output signal and to output a first delayed output signal;
a NAND gate to receive the input signal and the first delayed output signal, the first delay element causing the NAND gate to receive the first delayed output signal after the NAND gate receives the input signal, wherein the NAND gate is to output a first output signal in response to receipt of the input signal and the first delayed output signal;
a positive channel field effect transistor (PFET) to, responsive to receipt of the first output signal, provide a boost to the driver output signal;
a second delay element to receive the driver output signal and to output a second delayed output signal;
a NOR gate to receive the input signal the second delayed output signal, the second delay element causing the NOR gate to receive the second delayed output signal after the NOR gate receives the input signal, wherein the NOR gate is to output a second output signal in response to receipt of the input signal and the second delayed output signal; and
a negative channel field effect transistor (NFET) to provide drive strength to the driver output signal in response to receipt of the second output signal.

15. The circuit of claim 14, wherein the NAND gate is to output the output signal in response to the input signal being high and the delayed output signal being high.

16. The circuit of claim 14, wherein the second inverter has a second inverter PFET and a second inverter NFET, wherein the first delay element is to delay the output of the first delayed output signal a predetermined length of time to supplement the driver output signal from the second inverter PFET, and wherein the second delay element is to delay the output of the second delayed output signal a predetermined length of time to supplement the driver output signal from the second inverter NFET.

17. The circuit of claim 14, wherein the NOR gate is to output the second output signal in response to the input signal being low and the second delayed output signal being low.

* * * * *